US 6,484,292 B1

(12) United States Patent
Jain et al.

(10) Patent No.: US 6,484,292 B1
(45) Date of Patent: Nov. 19, 2002

(54) INCREMENTAL LOGIC SYNTHESIS SYSTEM FOR REVISIONS OF LOGIC CIRCUIT DESIGNS

(75) Inventors: Gitu Jain, San Jose, CA (US); Soren T. Soe, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/499,500

(22) Filed: Feb. 7, 2000

(51) Int. Cl.[7] .............................................. G06F 17/50
(52) U.S. Cl. .............................................. 716/2; 716/18
(58) Field of Search ...................................... 716/2, 18

(56) References Cited

U.S. PATENT DOCUMENTS

| | | | | |
|---|---|---|---|---|
| 4,882,690 A | * | 11/1989 | Shinsha et al. | 716/18 |
| 5,436,849 A | * | 7/1995 | Drumm | 716/18 |
| 5,761,079 A | * | 6/1998 | Drumm | 716/11 |
| 5,805,462 A | * | 9/1998 | Poirot et al. | 716/18 |
| 5,856,926 A | * | 1/1999 | Matsumoto et al. | 716/18 |
| 5,867,396 A | | 2/1999 | Parlour | 364/489 |
| 5,875,112 A | * | 2/1999 | Lee | 716/12 |
| 6,080,204 A | * | 6/2000 | Mendel | 716/7 |
| 6,102,964 A | * | 8/2000 | Tse et al. | 716/18 |
| 6,298,319 B1 | * | 10/2001 | Heile et al. | 703/26 |

OTHER PUBLICATIONS

D. Brand, Incremental Synthesis, IEEE/ACM International Conference on Computer–Aided Design, pp. 14–18, Nov. 1994.*

M. Fujita et al., Evaluation and Improvement of Boolean Comparison Method Based on Binary Diagrams, IEEE International Conference on Computer–Aided Design, pp. 2–5, Nov. 1988.*

* cited by examiner

Primary Examiner—Vuthe Siek
Assistant Examiner—A. M. Thompson
(74) Attorney, Agent, or Firm—LeRoy D. Mausu

(57) ABSTRACT

A method and apparatus for implementing incremental design changes. In various embodiments, primary outputs of a new design are compared for logical equivalence to corresponding primary outputs of a prior implementation. If the logic is equivalent, the implementation of the primary outputs from the prior implementation is reused to implement the corresponding primary outputs of the new design.

16 Claims, 5 Drawing Sheets

INCREMENTAL LOGIC SYNTHESIS SYSTEM FOR REVISIONS OF LOGIC CIRCUIT DESIGNS

FIELD OF THE INVENTION

The present invention generally relates to the implementation of circuit designs, and more particularly to reusing selected portions of a prior circuit implementation to implement portions of a new circuit design.

BACKGROUND

The term "net" as used herein refers to a conductive region connecting components of a user's circuit design. For example, one net may connect the output terminal of an AND gate to the input. terminal of another AND gate and to the input terminal of a flip-flop. An AND gate is one component type, and a flip-flop is another component type. An "instance" is a single occurrence of a component type. A "netlist" is a list of all the nets that connect the component instances of a user's design and the component instances connected by each net.

The circuit design process generally includes, in order, design entry, synthesis, optimization, device mapping, and place-and-route, along with functional and timing simulations to verify correctness. If an error is identified late in the process, much of the process may need to be repeated in order to integrate a design change.

One solution to avoid repeating the entire process of optimization, device mapping, and place-and-route is to only re-implement the parts of the design that changed from the previous design cycle. Although this solution may be fairly straightforward when using schematics for design entry (because changes to a schematic cause very little change in a netlist), it is more difficult when the design has been generated through the use of high-level languages and synthesis. That is, a small design change in a high-level language may substantially impact the entire design process, and the new implementation may no longer meet the designer's timing requirements, fit the target device, or have the same pin assignments as the prior implementation. Thus, additional work may be required to address the problems that were introduced by a small design change. It is desirable that significantly different implementations do not result from relatively small design changes, so that additional engineering costs are not incurred. An incremental design method that addresses the aforementioned problems, as well as other related problems, is therefore desirable.

SUMMARY OF THE INVENTION

The present invention generally relates to the implementation of circuit designs, and more particularly to testing for logical equivalence between portions of a new circuit design and portions of a prior circuit implementation and reusing selected portions of the prior circuit implementation to implement the new circuit design. By testing for logical equivalence instead of testing for structural equivalence, the present invention eliminates unnecessary repetition of stages of the design cycle such as optimization, device mapping, and place-and-route.

In various embodiments, the invention generally includes comparing for logical equivalence primary outputs of the new design to corresponding primary outputs of a prior implementation. If the logic is equivalent, the implementation of the primary outputs from the prior implementation is reused to implement the corresponding primary outputs of the new design.

In another embodiment, attributes can be associated with the primary outputs of the new design to selectively control whether elements of the prior implementation are used to implement the primary outputs. Thus, a designer has control over which portions of a new design are to be implemented without regard to the prior implementation.

For outputs in the new design that are not present in the prior implementation and for outputs in the new design having logic that has changed from the prior implementation, the primary outputs of the new design are expressed in terms of the logic from the prior implementation, thereby reusing portions of the prior implementation for the new and changed primary outputs.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Some of the terminology used in this description includes the following. An "output port" is a user-defined output, and an "input port" is a user defined input. A "primary output" is the end point of any combinational logic. Primary outputs may therefore include output ports and the end points of paths ending at registers. A "primary input" is the starting point of any combinational logic. Primary inputs therefore include input ports and register outputs used in logic.

A "design specification" refers to a user's design, which is specified, for example, in a hardware definition language (HDL). An initial design specification is referenced as S0, and the corresponding implementation is referenced as C0. A new specification derived from S0 is referenced as Sn, and the corresponding implementation is referenced as Cn. In order to reduce engineering time in producing implementation Cn, it is desirable to reuse as much of the implementation from C0 as is feasible in Cn. It will be appreciated that the saved engineering time includes both the implementation process and verification of the implementation. The process of verifying an entire design even though only a small change was made to the logic can be difficult and time-consuming.

In one embodiment, "implementation" refers to an optimized netlist, which is a result of optimizing logic in a netlist in accordance with various user-selected parameters, for example, limiting the number of inputs that can be used by any equation. The implementation also includes a mapping of the optimized logic to device or technology resources (e.g., programmable logic device (PLD) structures or discrete logic implemented in any process, such as CMOS). Optimizing and mapping processes as referred to in the embodiments described herein operate in accordance with algorithms known to those skilled in the art.

Figure 1:
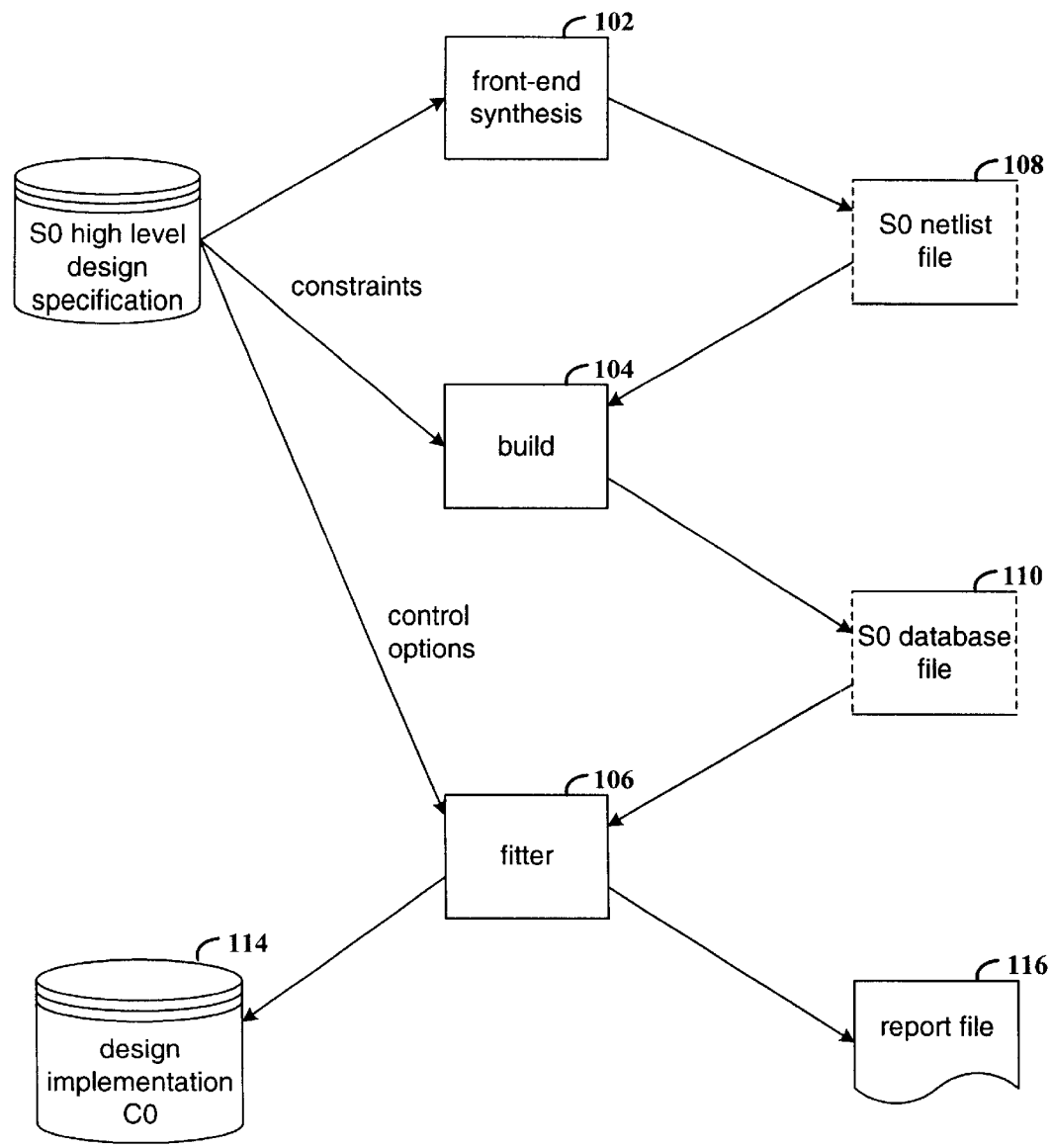
FIG. 1 is a data flow diagram of a prior art process for implementing a circuit design.

FIG. 1 is a data flow diagram of a prior art process for implementing a circuit design. The process is controlled by software elements that include front-end synthesis element 102, build element 104, and fitter element 106. Front-end synthesis element 102 inputs a circuit design specification, S0, as embodied in a hardware definition language, for example, and produces S0 netlist file 108. Build element 104 creates design database file 110 based on the input netlist and constraints associated with S0. Fitter element 106 optimizes the logic of the design as embodied in the S0 database file based on logic optimization control options as set forth in the S0 design specification. Fitter element 106 also maps the optimized logic to the technology or device resources and outputs C0 design implementation file 114 and report file 116. Report file 116 indicates the results of generating the implementation. The optimized and mapped logic of design S0 is embodied in C0 design implementation file 114.

Figure 2:
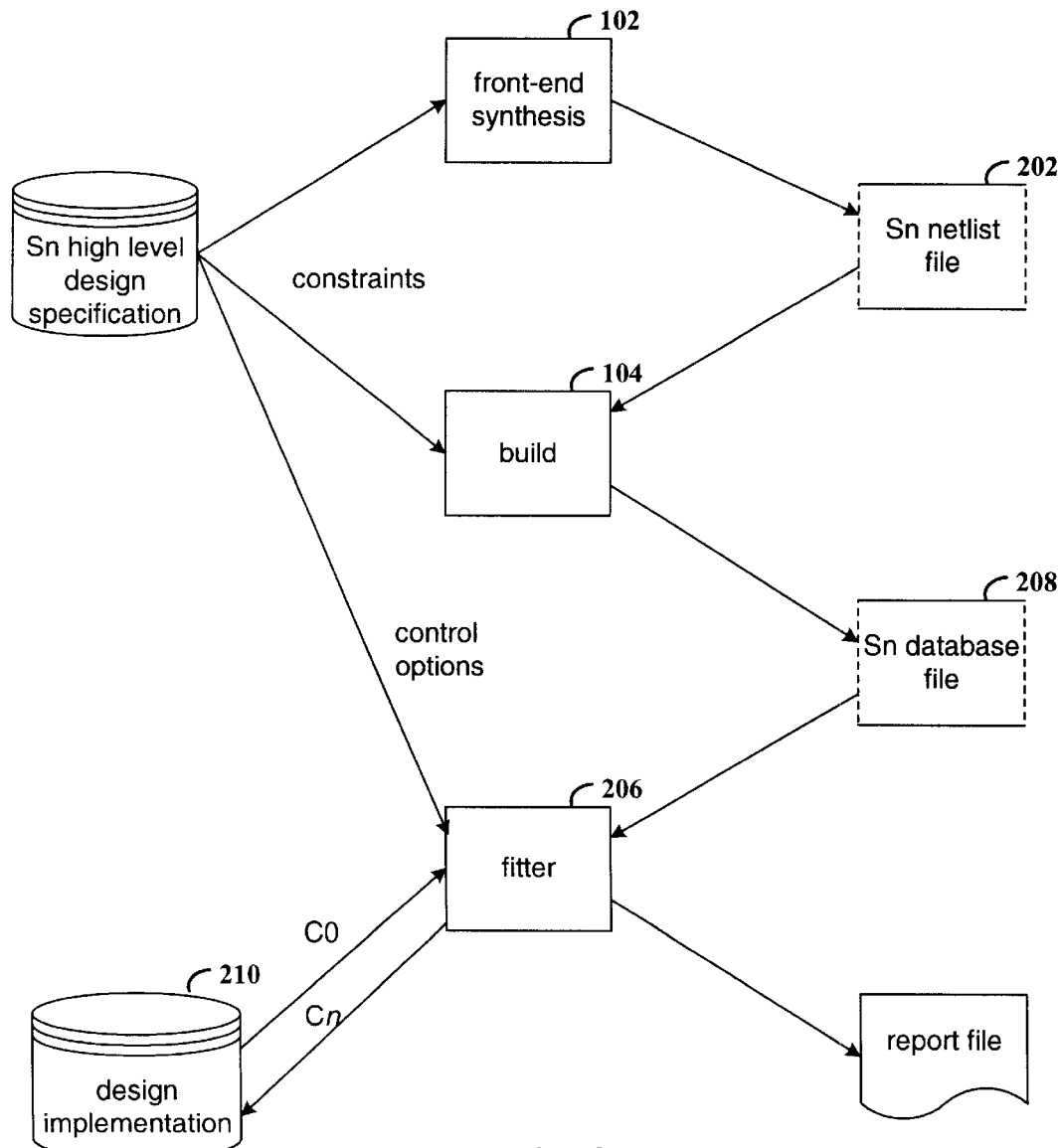
FIG. 2 is a data flow diagram of a process for incremental synthesis in accordance with one embodiment of the invention.

FIG. 2 is a data flow-diagram of a process for incremental synthesis in accordance with an example embodiment of the invention. The process generally uses selected portions of a prior circuit implementation, C0, in creating a new circuit implementation Cn for a circuit design specification Sn. Furthermore, well-known formal logic verification techniques are used to test for logical equivalence between portions of the C0 implementation and Sn logic. It is assumed in this example that Sn is derived from circuit design specification S0. However, it will be appreciated that S0 and Sn could be more loosely related, such as reusing portions of S0 in Sn, or could be entirely unrelated.

Front-end synthesis element 102 creates Sn netlist file 202 based on the Sn design specification, and build element 104 creates a new database file 208 based on the Sn netlist. Fitter element 206 applies formal verification techniques to check for logical equivalence between corresponding portions of implementation file 210 (C0) and netlist database 208 (Sn). A new implementation (Cn) is generated, based on reused portions of C0 and new implementation for portions of Sn.

Rather than comparing for structural equivalence between netlists, for example, the present invention uses formal verification techniques to test for logical equivalence between a new design and a prior implementation. Techniques that structurally compare netlists (S0 netlist to Sn netlist, for example) are unlikely to identify equivalences between netlists generated by different front-end synthesis tools. Furthermore, any optimization performed by front-end synthesis may result in structural differences between the netlists even though logically they may be the same.

Figure 3A:
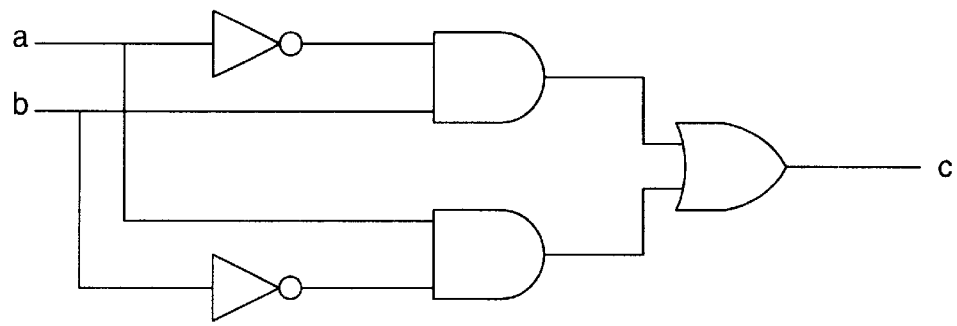
FIGS. 3A and 3B illustrate two structurally different implementations of logically equivalent netlist equations.
Figure 3B:
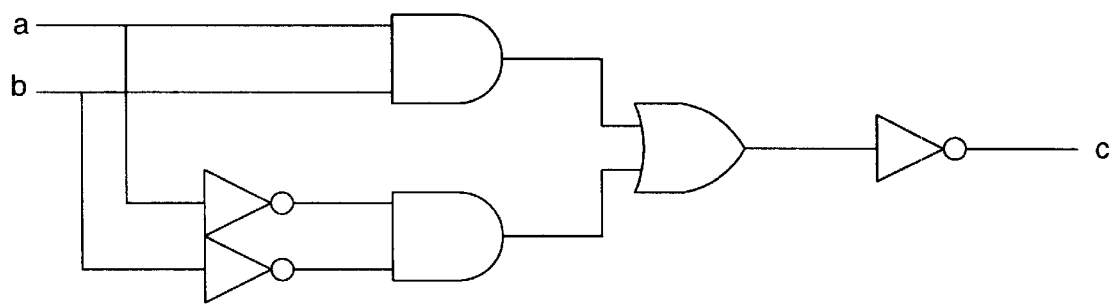

FIGS. 3A and 3B illustrate two structurally different implementations of logically equivalent netlist equations. FIG. 3A is the structural form of the equation c=a'b+ab', and FIG. 3B is the structural form of the equation c=(ab+a'b')'.

It will be appreciated that the netlist equations c=a'b+ab' and c=(ab+a'b')' are two different implementations of the XOR function. FIG. 3A is a logic representation of a'b+ab', and FIG. 3B is a logic representation of (ab+a'b')'.

The primary outputs of Sn are compared to corresponding primary outputs in C0 using formal logic verification techniques. The corresponding primary outputs are those having the same names. If a primary output is present in Sn and cannot be located in C0, the primary output of Sn is expressed, wherever possible, in terms of existing logic from C0, and then synthesized. If the name of a primary output changes from C0 to Sn while the logic remains unchanged, the primary output having the new name is therefore expressed in terms of the same logic from C0. It will be appreciated, however, that if the primary output is also used as a primary input, then it may not be possible to express the fanouts of the primary input in terms of logic from C0.

Where the logic for a primary output has changed or a new primary output is introduced in Sn, the primary outputs of Sn are expressed, wherever possible, in terms of existing logic from C0. This process is described in more detail in the discussion that accompanies FIG. 5.

The following is an example where a primary output z is added to Sn relative to S0. If z=a'bdef+a'b'e'+a'b'f'+a'd'e'+a'd'f' then synthesizing z without considering C0 may produce the following:

z=kla'+k'l'a' k=b'+d' l=e'+f'

However, if C0 includes x=ab+bd y=a'e'+a'f' then expressing. z in terms of C0 would produce z=xy'a'+x'y

Where fitter element 206 finds that a primary output of Sn is logically equivalent to a primary output of C0, no logic optimization and mapping is necessary, and the logic from C0 is used to implement that portion of Sn.

In the context of CPLD synthesis, fitter element 206 also considers input and output ports that are assigned to global input/output (I/O) pins in Sn. For such assignments, any signals in C0 that were optimized to these global I/O pins are converted to non-global control signals in Cn.

Figure 4:
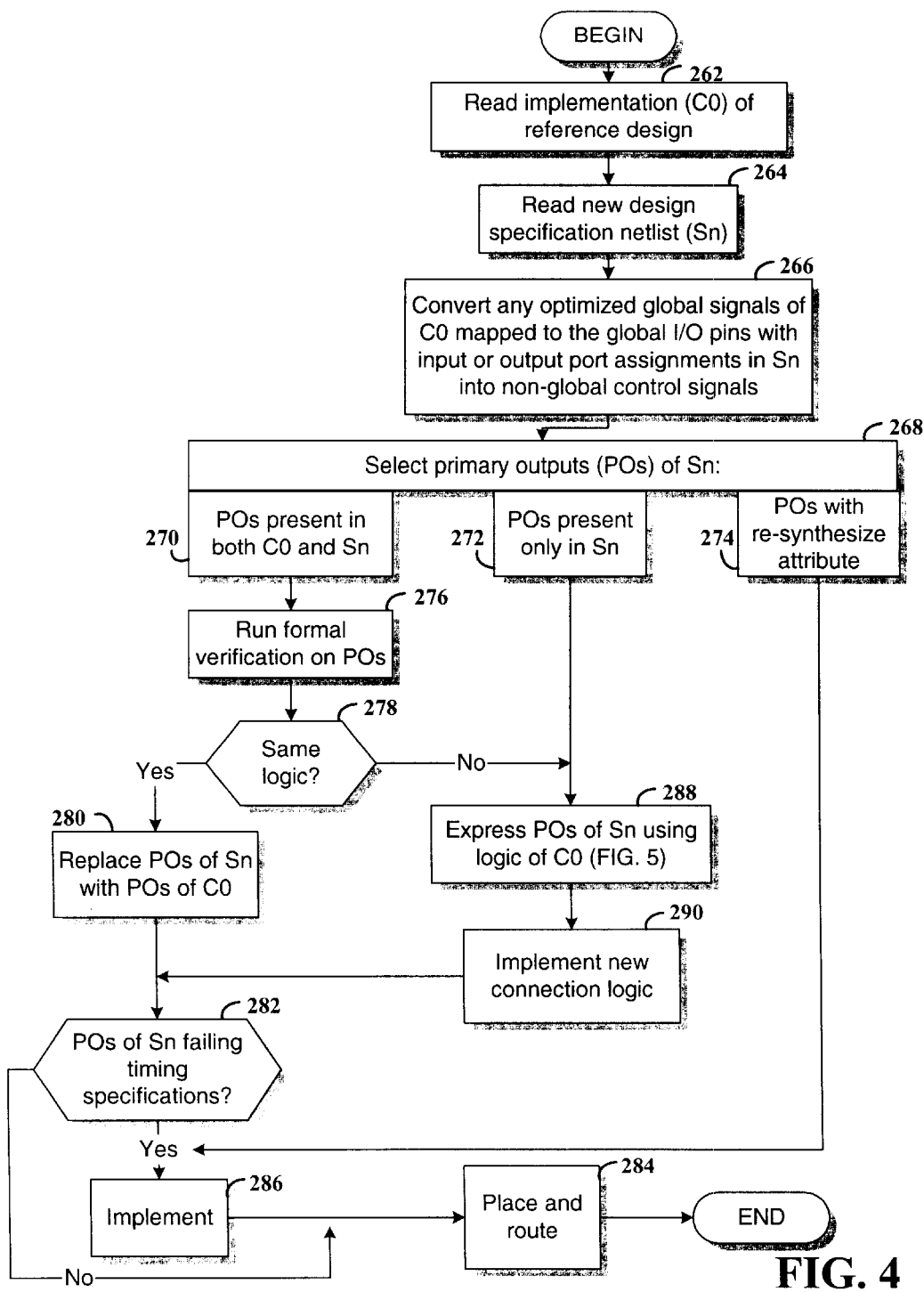
FIG. 4 is a flowchart of a process for incrementally synthesizing a design, in accordance with one embodiment of the invention.

FIG. 4 is a flowchart of a process for incrementally synthesizing a design, in accordance with one embodiment of the invention. A prior implementation C0 and a new design specification Sn are read at steps 262 and 264. It will be appreciated that in alternative embodiments the new design Sn could be read as either the netlist embodied in database file 208 or the netlist embodied in netlist file 202.

In the context of design synthesis for PLDs, there are global I/O pins and non-global I/O pins available on the device. If an output port of Sn is assigned to a non-global I/O pin, the implementation is unaffected. However, placement and routing are affected. If an output port of Sn is assigned to a global I/O pin, use of that pin is precluded for optimized global signals. Thus, if C0 contains a global signal optimized to the specified pin, the global signal is converted to a non-global control signal at step 266. Similarly, if an input port of Sn is assigned to a global I/O pin, any global signal optimized to the specified pin in C0 is converted to a non-global control signal. Step 268 separates the primary outputs (POs) of Sn into three categories: POs of Sn having the same names as POs in C0 (block 270), POs of Sn having names not found in C0 (block 272), and POs of Sn having a "re-synthesize" attribute (block 274). In the example embodiment, POs of Sn having the "re-synthesize" attribute are categorized as such, even if the name of a PO in Sn matches the name of a PO in C0. In other words, the user's specification of the re-synthesize attribute for a PO overrides reusing the implementation from C0.

For POs of Sn having the same names as POs in C0, the formal verification algorithm is applied at step 276 to each primary output to test for logical equivalence between the PO in the C0 implementation and the PO in the design Sn. For example, Boolean verification techniques involving Boolean Expression Diagrams (BEDs) are used to test for logical equivalence. In another embodiment, Binary Decision Diagrams (BDDs) are used. Those skilled in the art will recognize still other embodiments that use methods capable of converting a Boolean expression into canonical form.

Decision step 278 directs control to step 280 for POs in Sn that are logically equivalent to the POs in C0. At step 280, the optimized device mapping from C0 is used to implement the logically equivalent PO of Sn. Once the POs of Sn have been replaced, control is directed to decision step 282. If all the POs of Sn satisfy the timing specifications, control is directed to step 284 where conventional place and route processing is applied. For POs of Sn that fail timing specifications, control is directed to step 286 where those POs are implemented, i.e., optimized and mapped, without using logic from C0.

Figure 5:
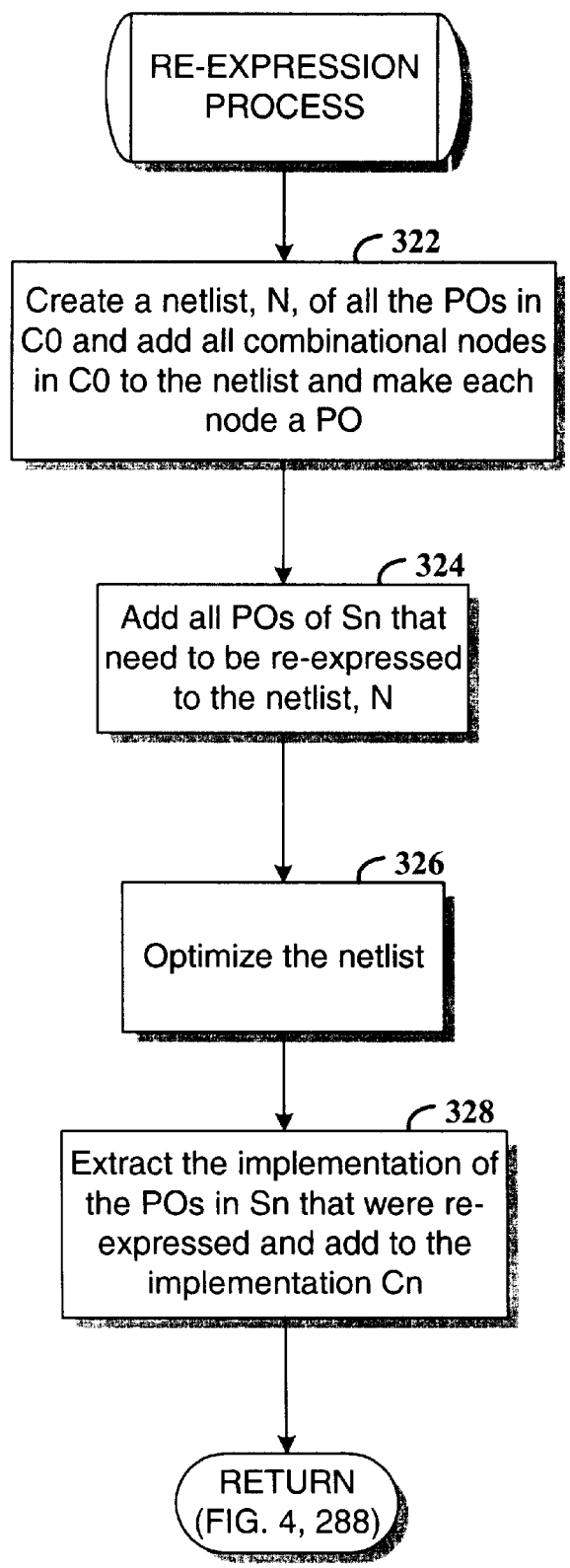
FIG. 5 is a flowchart of a process for expressing logic of a primary output of specification Sn in terms of implementation C0.

For POs in Sn that are not logically equivalent to the C0 implementation (see step 278), step 288 expresses the logic-of the Sn PO in terms of the implementation in C0, as further described in FIG. 5. The process of expressing a PO includes generating logic for that PO using existing logic from C0. Thus, at step 290, any new connection logic has to be implemented (i.e., optimized and mapped). POs that are present in Sn but not in C0 (block 272) also go through the process of expression in terms of C0 at steps 288 and 290.

The user can override implementation reuse of C0 for a PO of Sn. This override is accomplished with the "re-synthesize" attribute that can be associated with a primary output. When a PO has the re-synthesize attribute, the PO is implemented without regard to the logic from C0. This feature can be used to selectively optimize certain parts of a design. For example, if a designer finds that a primary output has too many levels of logic, the optimization parameters can be changed and the re-synthesize attribute can be applied to the PO. When the design specification is implemented, only the logic associated with the selected PO is implemented and the prior implementation is used for the other POs. With prior art software, the entire design is implemented without reuse, which may lead to a different, undesirable implementation. Block 274 illustrates the designation of POs with the resynthesize attribute.

Other types of possible design changes are described below and are referenced as "use cases."

In a first use case, no changes are made to the logic of a design and some of the paths in the netlist do not meet existing, changed, or new timing specifications. Only those paths are optimized and mapped without regard to C0, to meet the timing specifications.

A new primary input added to Sn will also be referenced in logic in Sn. Thus, in this second use case, the logic of a PO of Sn is identified as having changed. The logic of the modified output is expressed in terms of implementation C0, and the logic that connects existing logic from C0 with the modified PO is optimized and mapped.

The use case where. a primary input is removed is covered by the use cases above, because a primary input can only be removed as a result of a logic change that renders the input unused.

In a third use case, no logic changes are made to Sn, but the names of POs are changed, for example, by using a different front-end synthesis tool. The POs are identified as new. The logic is expressed in terms of C0, and because the logic is identical, the logic from C0 can be used without requiring any new connecting logic.

In another use case, no changes are made to the logic of Sn, and the names of primary inputs are changed, for example, by front-end synthesis. All affected POs are expressed in terms of C0, and the POs and-connecting logic are optimized and mapped.

In addition to timing specifications, various other control options can be specified by the user in order to control the optimization and mapping of a design. When changes are made to these control options, only the logic with the re-synthesize attribute or the logic that does not meet timing specifications is affected by the control options and re-optimized and re-mapped, while the logic of unaffected elements is neither re-optimized nor re-mapped. Thus, the portions of an existing implementation that satisfy the user's requirements can be reused. Example control options include a maximum number of inputs for any equation, a maximum number of p-terms that can be used in any equation, whether multi-level logic optimization is applied, whether p-term control signals can be converted into global signals to improve timing or density, the default slew rate for all output ports, the default power mode of all macrocells, and whether user-specified pin assignments should be ignored or respected. These and other control options are recognized by those skilled in the art.

FIG. 5 is a flowchart of a process for expressing logic of primary outputs (POs) of Sn in terms of implementations from C0. At step 322, a netlist N is created from the POs of C0. All combinational logic of C0 is added to N and made a primary output. At step 324, all POs in Sn that need to be expressed are added to netlist N. In another embodiment for expressing PLD logic, POs of Sn that are inputs to registers are excluded from the netlist N since they are not-available independent of the register.

The netlist N is optimized at step 326. The optimization can be accomplished using a conventional optimization tool. Generally, if the logic of a PO in Sn is equivalent to the logic of a PO in C0, the logic from C0 is used. The optimizer may also use multiple primary outputs from the netlist created in step 322 to implement a PO of Sn, in addition to some glue logic, if there is no identical PO in C0.

At step 328, the implementation of the POs of Sn is extracted from the netlist N. and the implementation is added to the new implementation Cn. Control is then returned to step 288 of FIG. 4.

The present invention is believed to be applicable to a variety of processes for implementing circuit designs and has been found to be particularly applicable and beneficial in PLDs. While the present invention is not so limited, an appreciation of the present invention has been provided by way of specific examples involving PLDs. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A computer-implemented method for implementing a second circuit design derived from a first circuit design, the first design embodied in a first implementation, and the first implementation and second design including primary outputs, comprising:

comparing for logical equivalence corresponding primary outputs in the first implementation and the second design, and testing for user-specified re-synthesize attributes associated with the primary outputs of the second design; and for primary outputs of the second design having re-synthesize attributes, creating primary outputs in the second implementation without reusing implementation of the primary outputs from the first implementation, and for primary outputs of the second design that are logically equivalent to corresponding primary outputs in the first implementation, reusing implementation of the primary outputs from the first implementation as implementation of the primary outputs of the second design in a second implementation.

2. The method of claim 1, further comprising comparing for logical equivalence using formal verification techniques.

3. The method of claim 2, further comprising comparing for logical equivalence using Boolean expression diagrams.

4. The method of claim 1, further comprising expressing a primary output of the second design that is not present in the first implementation in terms of logic that is present in the first implementation.

5. The method of claim 1, further comprising expressing primary outputs of the second design having logic changes from the first implementation in terms of logic that is present in the first implementation.

6. The method of claim 5, further comprising:

creating a combined netlist including primary outputs of the first implementation and the second design;

adding all combinational nodes from the first implementation to the combined netlist and making each combinational node from the first implementation a primary output; and running an optimization tool on the combined netlist.

7. The method of claim 1, wherein if the second design includes an assignment of an output port to a global input/output pin, further comprising converting global signals mapped to the global input/output pin in the first design into non-global control signals in the second implementation.

8. The method of claim 1, wherein if the second design includes an assignment of an input port to a global input/output pin, further comprising converting global signals mapped to the global input/output pin in the first design into non-global control signals in the second implementation.

9. The method of claim 1, further comprising:

creating a first design netlist from a first design specification using a first front-end synthesis tool;

creating a second design netlist from a second design specification using a second front-end synthesis tool, wherein the second design specification describes the second circuit design; and using the second design netlist to compare for logical equivalence corresponding primary outputs in the first implementation and the second design.

10. The method of claim 9, wherein the first front-end synthesis tool is the same as the second front-end synthesis tool.

11. The method of claim 9, wherein the first front-end synthesis tool is different from the second front-end synthesis tool.

12. The method of claim 11, wherein the second design netlist is structurally different from the first design netlist.

13. The method of claim 1, further comprising:

optimizing logic paths of the second design that do not meet timing specifications; and reusing implementation of logic paths from the first implementation in the second implementation for logic paths that satisfy the timing specifications.

14. The method of claim 1, wherein the first implementation has associated therewith a first set of optimization criteria, and further comprising:

optimizing selected portions of the second design specification in creating the second implementation, wherein the selected portions include portions having associated therewith a re-synthesize attribute and portions failing to meet a second set of optimization criteria associated with the second design specification.

15. An apparatus for implementing a second circuit design derived from a first circuit design, the first design embodied in a first implementation, and the first implementation and second design including primary outputs, comprising:

means for comparing for logical equivalence corresponding primary outputs in the first implementation and the second design;

means for testing for user-specified re-synthesize attributes associated with the primary outputs of the second design;

means for creating, for primary outputs of the second design having re-synthesize attributes, primary outputs in the second implementation without reusing implementation of the primary outputs from the first implementation; and means for reusing, for primary outputs of the second design that are logically equivalent to corresponding primary outputs in the first implementation, implementation of the primary outputs from the first implementation as implementation of the primary outputs of the second design in a second implementation.

16. A system for incremental synthesis, comprising:

a front-end synthesis tool configured and arranged to generate a netlist from an input design;

a fitter tool configured and arranged to optimize and map the netlist and produce an implementation, the fitter tool further configured and arranged to read a prior implementation generated from a prior design, compare for logical equivalence primary outputs of the prior implementation and primary outputs of the netlist, and reuse implementation of,primary outputs from the prior implementation as implementation of logically equivalent primary outputs of the netlist.

* * * * *